(12) United States Patent
Bhatti

(10) Patent No.: US 7,461,690 B2
(45) Date of Patent: Dec. 9, 2008

(54) OPTIMALLY SHAPED SPREADER PLATE FOR ELECTRONICS COOLING ASSEMBLY

(75) Inventor: Mohinder Singh Bhatti, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 345 days.

(21) Appl. No.: 11/236,019

(22) Filed: Sep. 27, 2005

(65) Prior Publication Data

US 2007/0068666 A1 Mar. 29, 2007

(51) Int. Cl.
*F28F 7/00* (2006.01)
*H05K 7/20* (2006.01)
*H01L 23/34* (2006.01)

(52) U.S. Cl. ............ 165/185; 165/80.3; 361/704; 257/722

(58) Field of Classification Search .......... 165/185, 165/80.3; 361/704; 257/722
See application file for complete search history.

(56) References Cited

U.S. PATENT DOCUMENTS

| | | | |
|---|---|---|---|
| 3,361,195 A | | 1/1968 | Meyerhoff et al. |
| 4,712,609 A | | 12/1987 | Iversen |
| 5,172,755 A | * | 12/1992 | Samarov ............ 165/80.3 |
| 5,844,313 A | * | 12/1998 | Hoffmann ........... 257/722 |
| 6,196,300 B1 | * | 3/2001 | Checchetti ........... 165/80.3 |
| 6,253,835 B1 | | 7/2001 | Chu et al. |
| 6,333,551 B1 | * | 12/2001 | Caletka et al. ......... 257/707 |
| 6,446,708 B1 | * | 9/2002 | Lai .................... 165/80.3 |
| 7,063,130 B2 | * | 6/2006 | Huang ................ 165/121 |
| 7,100,281 B2 | * | 9/2006 | Kemink et al. ...... 29/890.054 |
| 2002/0195229 A1 | | 12/2002 | Hsieh et al. |
| 2003/0024693 A1 | * | 2/2003 | Petty et al. .......... 165/121 |
| 2003/0196780 A1 | * | 10/2003 | Hegde ............... 165/80.3 |

FOREIGN PATENT DOCUMENTS

| | | |
|---|---|---|
| DE | 1150723 | 6/1963 |
| DE | 4338107 | 3/1995 |
| EP | 0321899 | 6/1989 |

OTHER PUBLICATIONS

European Search Report dated Jul. 3, 2008.
P. 238/Research Disclosure; Feb. 2001; XP001103746 19000101, Jan. 1, 1900 (Jan. 1, 1900) XP001103746.

* cited by examiner

*Primary Examiner*—Cheryl J. Tyler
*Assistant Examiner*—Brandon M Rosati
(74) *Attorney, Agent, or Firm*—Paul L. Marshall

(57) ABSTRACT

A spreader plate for an electronic component cooling assembly has a flat lower surface and a substantially arcuate upper surface of larger surface area than the lower surface which is generally convex and arcuate in cross section, and which decreases in thickness, as measured between the lower and upper surfaces, moving from the central area out to the periphery. This allows the heat flux lines to be more evenly spaced and regular in length, as compared to a typical plate with flat upper and lower surfaces of equal surface area.

1 Claim, 3 Drawing Sheets

OPTIMALLY SHAPED SPREADER PLATE FOR ELECTRONICS COOLING ASSEMBLY

TECHNICAL FIELD

This invention relates to electronics cooling in general, and specifically to a novel shape for the spreader plate of a heat sink used to cool a CPU or similar heat producing electronic component.

BACKGROUND OF THE INVENTION

Semiconductor chips are continually increasing in power, compactness and waste heat production. While they must be consequently cooled, for a number of reasons, this is generally not done by directly cooling the chip itself with a forced stream of cooling fluid or liquid. At least one surface of a chip is exposed for heat extraction, although it generally is not directly exposed, itself being covered by a thin "lid" of polished metal, sometimes referred to as an integral heat sink. The exposed surface area of the chip or CPU is small, and in order to forcibly contact such a small surface with a sufficient and effective volume of coolant (whether air or liquid), the flow rate would be high. Consequently, the exposed surface of the chip is generally thermally bonded (by a suitable conductive glue like material) to the flat lower surface of a conductive metal plate, sometimes called a cold plate or a cold sheet, although often described by the misnomer "heat sink." The plate typically is regular and rectangular in cross section, with a flat lower surface significantly larger in area than the chip, and an upper surface of equal area that comprises a series of straight, parallel, thin and closely packed fins. Heat does not "sink" or disappear in the plate in any sense, but is continually removed therefrom as it flows into the plate from the chip being cooled. Consequently, the plate may be more accurately referred to as a "spreader plate," that is, a plate designed to spread out the area from which heat can be extracted. The upper surface (and fins, if present) are directly exposed to the forced fluid to convectively remove heat from the chip, which is effectively protected.

The essentially universal shape for the conductive plate, hereinafter referred to as a spreader plate, is a flat, constant thickness sheet, with parallel upper and lower, equal area flat surfaces. The heat flux in this or any other conductor, that is, the heat flow per unit of cross sectional area, is uniquely determined by the nature of, the shape and conductivity of, the medium itself, and is driven by a temperature gradient, that is, the difference in temperature between the lower surface (where heat is added from component 10) and the upper surface, where heat is extracted, generally by a forced air or liquid flow. A typical shape of such a plate is shown in FIGS. 1 and 2 of U.S. Pat. No. 3,361,165, and also in FIG. 1 of the drawings of the instant application, with a component 10 bonded to the larger bottom surface of a "heat sink member" 12, a conventional flat plate shape, rectangular in cross section. The cooling scheme disclosed in the patent is somewhat atypical, in that the plate 12 itself contains internal liquid channels for cooling, rather than fins on the upper surface of the plate cooled by pumped air or liquid. This particular patent does recognize that the heat flux in such a design is not symmetrical and regular, but is instead concentrated and denser near the center, directly over the component 10. This results from the fact that the central area of the flat upper surface is closer to the lower surface than the peripheral area. This asymmetrical flux density is represented by the curved but essentially vertical dotted lines, sometimes referred to in the literature as "adiabats" and the isothermal lines or isotherms, the curved lines drawn perpendicularly to the heat flux lines. Together, the crossing lines create a checkered series of cross sectional area elements. The approach described in the patent itself is not to modify the degree of thermal asymmetry, but rather to concentrate the fluid carrying channels near the center, or the area of highest heat flux. The lower corners especially of the plate, the corners of the rectangular cross section, provide little assistance in the heat removal process, as they contain no channels, and are essentially wasted mass.

As noted, it is more common to simply supply a heat transfer fluid or gas to the upper surface of such a spreader plate, which is often enhanced with added fins or the like, rather than to create internal channels in the plate. Unless the cooling fluid/gas applied to the upper surface of such planar spreader plate can be concentrated toward the center, or unless physical heat transfer enhancements, such as pin projections, are more densely applied to the central area, the heat transfer out of the spreader plate will be less efficient. Either alternative is more costly and difficult than simply applying the cooling fluid and/or any heat transfer enhancements symmetrically and evenly to the spreader plate upper surface.

SUMMARY OF THE INVENTION

The subject invention modifies the typical spreader plate shape to improve its level of thermal symmetry, so that convective heat transfer therefrom is more efficient, and the conductive mass is better utilized.

Rather than a flat plate with parallel, equal area upper and lower surfaces, the spreader plate of the invention has a shape better matched to the ideal heat flux pattern. The flat lower surface is more nearly equal in area to the chip itself, and the upper surface is larger in area than the bottom surface, and is not flat and planar. Instead, it is effectively curved to more nearly parallel the isothermal lines. The side surfaces of the plate are also not flat and parallel, but diverge from the chip so as to more nearly parallel the shape of the heat flux lines. As a consequence, the upper, convective surface of the spreader plate is much more nearly isothermal than a typical flat surface, with the heat flux spread out more evenly across the central and peripheral areas. Therefore, an even flow of fluid may be directed over its surface, and symmetrical and regular physical enhancements may be applied to the upper surface. Adding to the mass efficiency, the unused "corners" of the typical rectangular cross section are removed, and the extra mass effectively moved to the area of the spreader plate that can better utilize it.

DESCRIPTION OF THE PREFERRED EMBODIMENT

Figure 1:
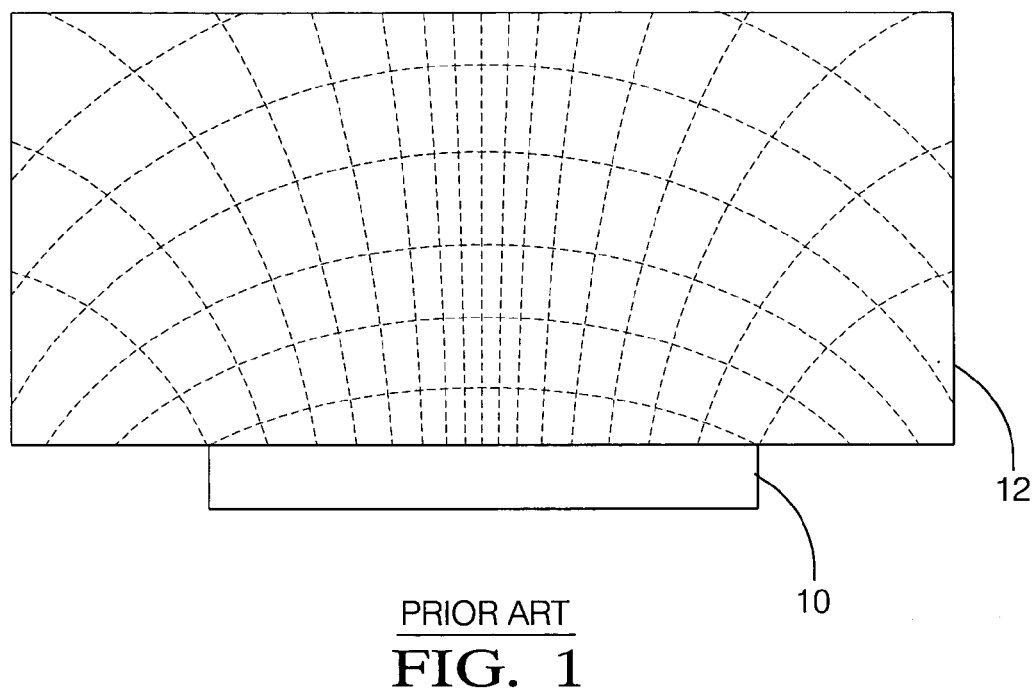
FIG. 1 is a view of the prior art spreader plate described above.
Figure 2:
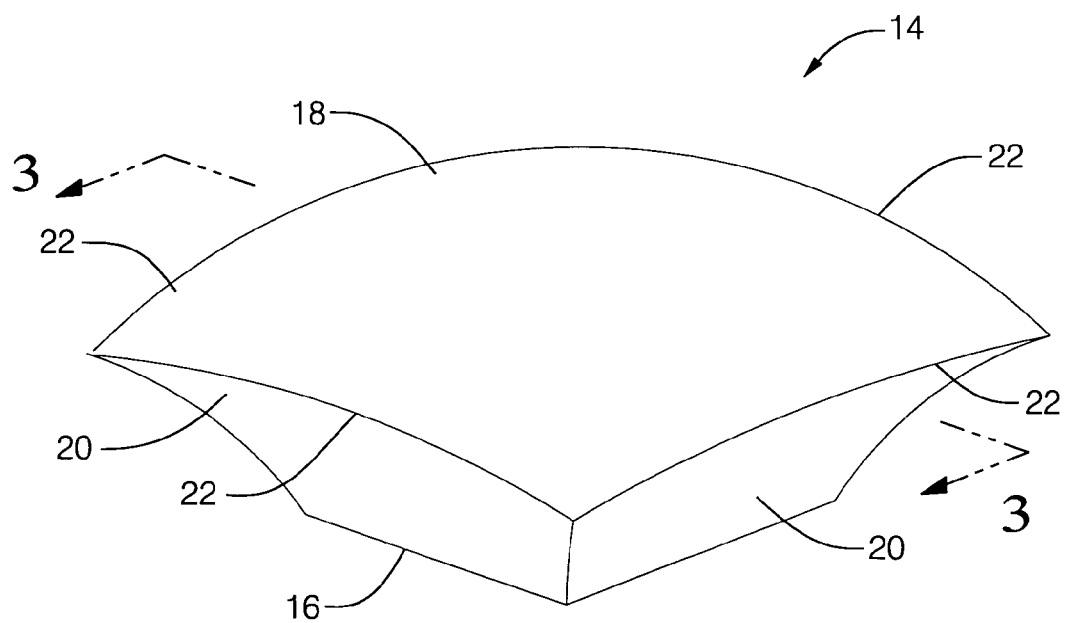
FIG. 2 is a perspective view of a preferred embodiment of the invention; with the shape of the FIG. 1 design superimposed in dotted lines.
Figure 3:
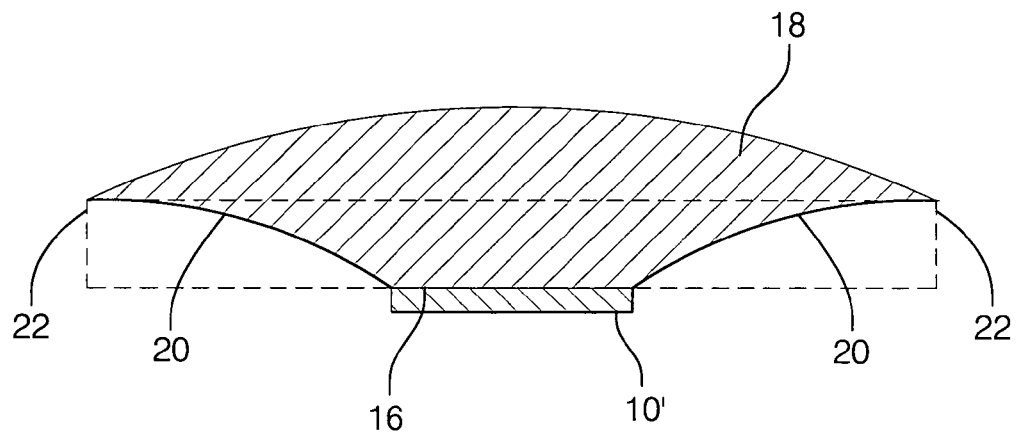
FIG. 3 is a cross section of the embodiment shown in FIG. 2 taken along the plane represented by the line 3-3.

Referring first to FIGS. 2 and 3, the same type of computer chip (or other heat producing electronic component), indicated generally at 10', is cooled by the novel shaped heat spreader plate of the invention, an idealized embodiment of which is indicated generally at 14. Spreader plate 14, by comparison to the typical rectangular cross sectioned plate (indicated by a superimposed dotted line in FIG. 3), has a smaller lower surface 16, substantially the same size as the component 10' to which it is thermally bonded. In addition, the upper surface 18 comprises a shallow, convex and compound (curving in both directions) arc. FIG. 3 shows its cross section at the center plane 3-3, which would be the same taken ninety degrees thereto. Every cross section taken parallel to center plane 3-3, at least out as far as the edge of the lower surface 16, would have a similar shape, but shallower, and of less total thickness. The block of material so shaped is thus thickest and most massive right over the center of the component 10', and progressively thinner moving outwardly therefrom. The side surfaces 20 are all identical in shape and size (for the case of a square lower surface 16), and are also not flat, nor parallel, but shallow, concave arcs, which diverge outwardly and upwardly from the edges of the lower surface 16 up to the "eaves" 22, the lines where they intersect with the upper surface 18. In this idealized form, the eave lines 22 are also complexly curved, that is, curved convexly and inwardly, when viewed downwardly and perpendicular to the plane of lower surface 16 and also curved downwardly, when viewed parallel to the plane of lower surface 16. The most significant difference from the conventional shape is best illustrated by the dotted line in FIG. 3. There is more material above the flat plane where the upper surface of a conventional, flat plate would be, especially near the center, but relatively less material outboard of the lower surface 16, because of the way that the side surfaces 20 are formed. In effect, the mass of conductive material is redistributed for efficiency, as discussed next. While the idealized shape shown is more complex than a flat plate, and not amenable to simple manufacturing methods such as extrusion, it could be cast from molten material, forged to near net shape from a simpler blank, or even machined to shape from a solid block, if desired.

Figure 4:
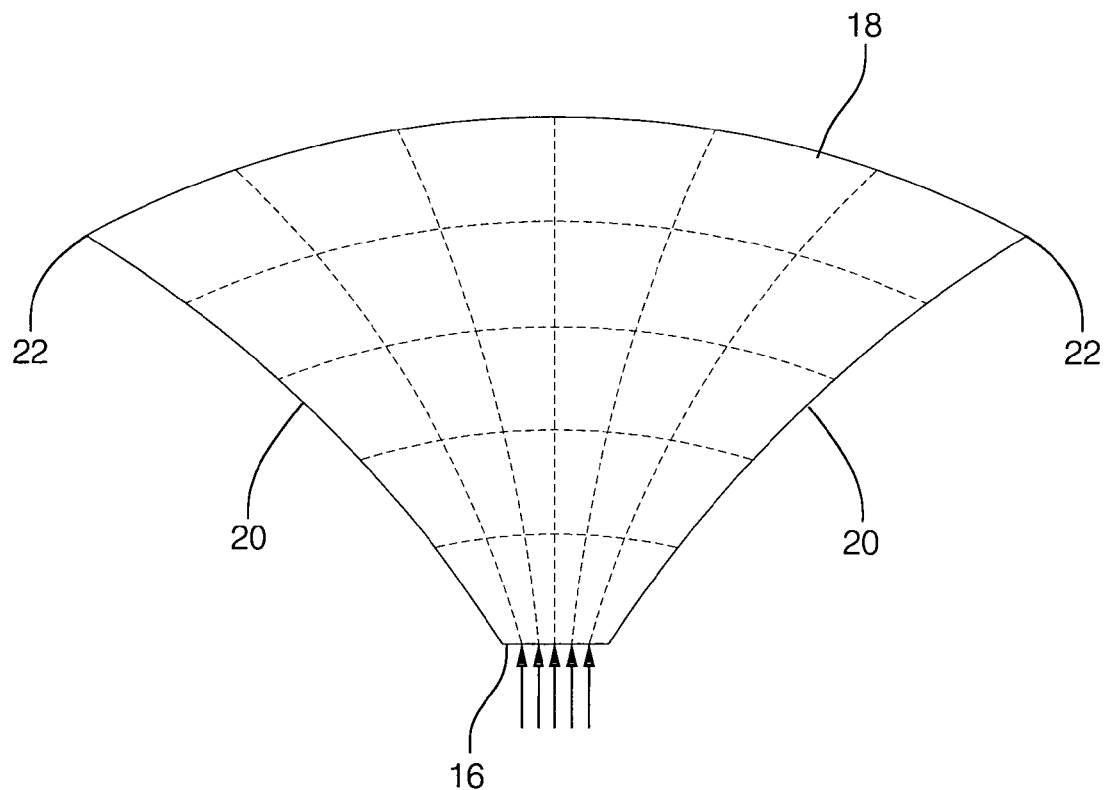
FIG. 4 is a schematic view of the cross section of FIG. 3 showing the heat flux lines and isotherms.

Referring next to FIG. 4, the purpose behind the novel shape described is illustrated. As noted above, the uneven heat flux present in a typical, flattened spreader plate with a planar upper surface and rectangular cross section is concentrated at the center, and diminished at the periphery. Here, the curved upper surface 18 and the curved and diverging side surfaces 20 match the shape of the spreader plate to the heat flux. The substantially vertical flux lines shown are substantially equal length, as measured between the lower 16 and upper surface 18, and are substantially evenly spaced, rather than being shorter and denser near the surface. The isothermal lines (the curved lines drawn perpendicular to the flux lines) are substantially parallel to one another, and substantially parallel to the upper surface 18. The heat flow that is spread out and evened out by the novel shaped plate results in an upper surface 18 that is more nearly isothermal itself. Therefore, any cooling fluid flow applied to upper surface 18, or any physical enhancements applied to upper surface 18, need not be concentrated near the center of upper surface 18 (over the component 10') for maximum efficiency.

Figure 5:
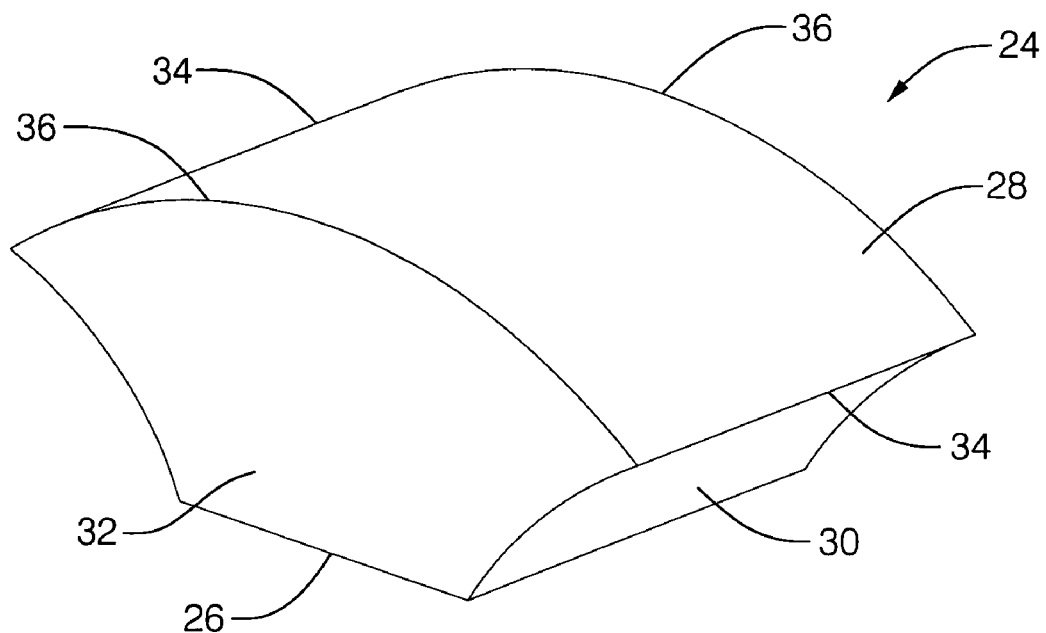
FIG. 5 is a perspective view of a more easily manufactured variant of the ideal embodiment of FIG. 2.

Referring next to FIG. 5, an alternate embodiment of simpler manufacture, if slightly less efficiency, is illustrated. Spreader plate 24 is cut from a continuous extrusion so as to have a lower surface 26 similar in size to surface 16 of the prior embodiment, and an upper surface 28 that is arcuate in cross section, but with a simple, constant arc every cross section of which would be the same if taken at, or parallel to, the plane 3-3 in the first embodiment above. The two side surfaces 30 would have a similar curvature to the side surfaces 20 of the first embodiment, but the end surfaces 32 would be flat. The two eave lines 34 where the curved sides intersect the simple arc of the upper surface 28 are straight lines, while the other two eave lines 36 are now simple arcs, curved in only one direction. The simpler shape here departs from the ideal shape of the first embodiment, matching it exactly at the central cross section mid way between the flat end surfaces 32, but departing from it moving from the central cross section toward the flat end surfaces 32, and so also does not match the optimum efficiency of the first embodiment. However, the simpler shape of the upper surface 28 would be more amendable to the addition of conventional heat transfer enhancements. For example, a length of conventional corrugated metal fin could easily be stretched over its simple arcuate shape. Alternatively, integral fins could be formed along the length of the upper surface 28 as an integral part of the extrusion, or machined in afterward.

Figure 6:
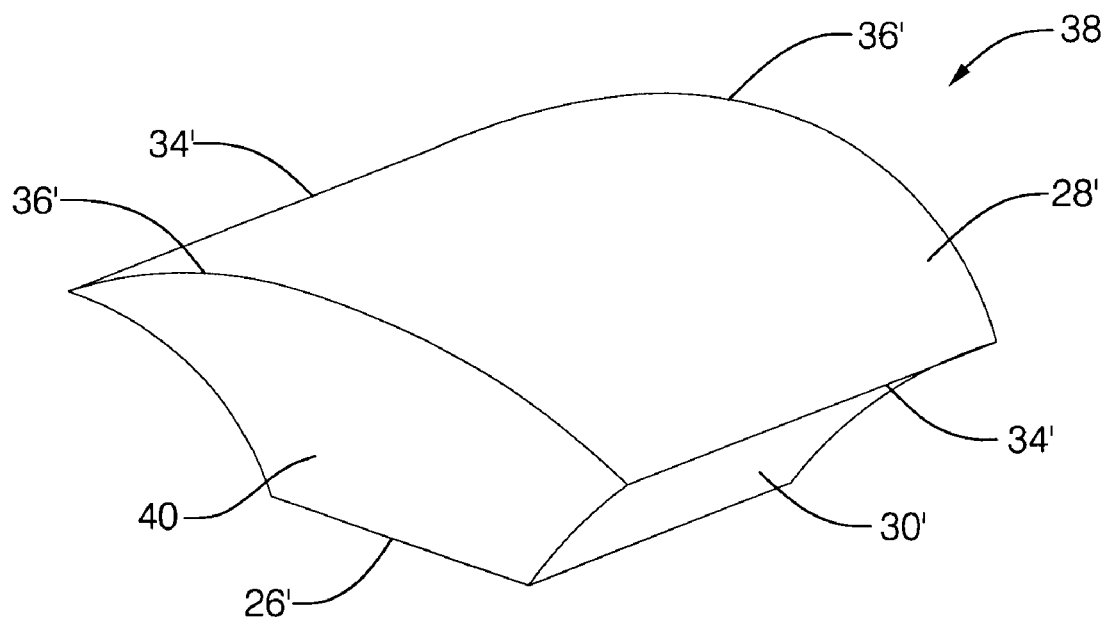
FIG. 6 is a perspective view of a variant of the embodiment of FIG. 5.

Referring next to FIG. 6, another alternate embodiment, indicated generally at 38 is very similar to that in FIG. 5, is somewhat closer to the idealized shape of the FIG. 2 embodiment. Here, the same basic extrusion is the basis of the structure, with several areas that are the same basic size and shape as the corresponding surfaces in the prior embodiment, and so given the same number with a prime (') for ease of comparison. The end surfaces 40, however, instead of flat and parallel, like the end surfaces 32 in embodiment 24, are machined out with an arc matching that of the side surfaces 30'. This has the effect of putting slightly more metal in the embodiment 38, and lengthening the upper surface 28'. The two eave lines 34' are still straight, if somewhat longer, while the eave lines 36' are now complexly curved, similar to the eave lines 22 in the first embodiment. This approaches more nearly the idealized shape, but with an additional manufacturing step, compared to embodiment 24, which is the added machining of the initially flat end surfaces 40 into the arcuate shape shown.

Other variants of the basic embodiments shown may be imagined, which would also depart somewhat from the idealized optimal shape, but be potentially easier to manufacture. For example, the simple arcuate upper surface 28 of embodiment 24 could be approximated by a series of two or more flat surfaces, whose length ran coaxial to the arcuate upper surface 28. Such a series of flats would be simple to machine, while still being effectively arcuate, and could also have fins or other enhancements easily thermally joined thereto. Whatever the shape of the upper surface, complex curve or simple elongated (extruded) arc, the side and end surfaces could be formed to be flat, or even flat and parallel to one another, rather than divergent. This, again, would be a simpler shape, but not as ideal insofar as the side surfaces would not be substantially parallel to the heat flux lines, as in the more idealized shape. Most broadly, the component to be cooled could have any peripheral shape, even circular. In that case, the plate would have a circular lower surface, and a general mushroom or muffin shape, with an upper surface that was arcuate not only in each orthogonal direction, but in every radial direction. The same basic "fitting" of the shape of the upper surface to the naturally occurring lines of heat flux would apply.

The invention claimed is:
1. A heat spreader plate for use with a heat producing electronic component, said component having a substantially flat exposed surface of predetermined size from which heat is to be extracted, said spreader plate comprising, a planar lower surface substantially matching the size of the exposed surface of said component and adapted to be thermally bonded thereto, a non planar, substantially arcuate and convex upper surface of larger surface area than said lower surface and having a greatest thickness located substantially over said lower surface and diminishing in thickness moving toward the periphery of said upper surface, whereby the lines of heat flux radiating from said component and lower surface to said upper surface are substantially equal in length and substantially evenly spaced across said upper surface; wherein said component surface and plate lower surface are substantially rectangular, and said plate further has at least one pair of opposed, non parallel side surfaces diverging from said lower surface and extending to said upper surface; and wherein said side surfaces are substantially arcuate and concave.

* * * * *